(12) United States Patent
Takagi

(10) Patent No.: US 6,396,854 B1
(45) Date of Patent: May 28, 2002

(54) ENCASED SEMICONDUCTOR LASER DEVICE IN CONTACT WITH A FLUID AND METHOD OF PRODUCING THE LASER DEVICE

(75) Inventor: Kazuhisa Takagi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/581,423

(22) PCT Filed: Dec. 15, 1997

(86) PCT No.: PCT/JP97/04599

§ 371 (c)(1),
(2), (4) Date: Jun. 13, 2000

(87) PCT Pub. No.: WO99/31774

PCT Pub. Date: Jun. 24, 1999

(51) Int. Cl.[7] .................................................. H01S 3/10
(52) U.S. Cl. .............................. 372/20; 372/35; 372/28; 372/34; 372/32; 356/350
(58) Field of Search ............................. 372/34, 35, 20, 372/28, 32; 356/350

(56) References Cited

U.S. PATENT DOCUMENTS 5,157,461 A * 10/1992 Page ........................... 356/350
5,982,804 A * 11/1999 Chen et al. .................... 372/96

FOREIGN PATENT DOCUMENTS

| JP | 61-129894 | 6/1986 |
| JP | 8-116138 | 5/1996 |
| JP | 1-179438 | 7/1999 |

OTHER PUBLICATIONS

Sudoh et al.; "Wavelength trimming technology for multiple–wavelength distributed–feedback laser arrays by photo–induced refractive index change", *Electronics Letters*, vol. 33, No. 3, pp. 216–217, Jan. 30, 1997.

Bosc et al.; "A New Experimental Method to Improve Parameter Determination of Integrated Optical Components", *IEEE Photonics Technology Letters*, vol. 4, No. 5, pp. 648–650, May 1997.

* cited by examiner

*Primary Examiner*—Paul Ip
*Assistant Examiner*—Cornelius H. Jackson
(74) *Attorney, Agent, or Firm*—Leydig, Voit & Mayer, ltd.

(57) ABSTRACT

At least part of the waveguide of a laser, the waveguide including a first cladding layer, an active layer, and a second cladding layer of a second conductivity type, and, for a ridge type laser, a ridge in the second cladding layer, has a width such that light leaks from the side walls of the waveguide. A case encloses the side walls of the waveguide and a fluid having a refractive index is sealed in the case in contact with the side walls of the waveguide. A characteristic of the laser can be adjusted easily. Therefore a laser having a uniform characteristic can be provided at a low cost. This laser is useful as a light source for wavelength multiplex transmission used for optical transmission, of a main line system, such as a submarine cable.

18 Claims, 6 Drawing Sheets

US 6,396,854 B1

ENCASED SEMICONDUCTOR LASER DEVICE IN CONTACT WITH A FLUID AND METHOD OF PRODUCING THE LASER DEVICE

TECHNICAL FIELD

The present invention relates to a laser device and a method of producing a semiconductor device and, more particularly, to a laser device that allows adjustment of characteristic values of a semiconductor laser element after producing the laser, and a method of producing the laser device.

BACKGROUND ART

As the society becomes increasingly dependent on the information technologies, various communications apparatuses are being imposed with requirements to have multimedia capabilities. Thus processing speeds and data handling capacities of these apparatuses have been increased, and attempts have been made for the application of wavelength division multiplexing transmission technology to optical signal transmission over trunk lines such as submarine cables.

In the wavelength division multiplexing transmission, distributed feedback semiconductor laser devices (hereafter referred to as DFB-LD) is used as the light source with 20 to 100 DFB-LDs of different oscillation wavelengths being arranged in an array, each oscillating to emit light at a predetermined wavelength that is transmitted by an optical cable and combined with other light in a coupler. It is therefore important in achieving wavelength division multiplexing transmission to stabilize the oscillation wavelength of each DFB-LD and accurately determine the intervals between the oscillation wavelengths.

A band of wavelengths used in the wavelength division multiplexing transmission is defined according to a recommendation by ITU-T (International Telecommunications Union, Telecommunication Standardization Sector), with the interval between adjacent wavelengths being regulated to be 0.8 nm. Accordingly, it is recognized that the DFB-LD used as the light source preferably oscillates at a wavelength within ±0.1 nm of the defined wavelength.

However, the DFB-LD of the prior art has a problem that, since the accuracy of oscillation wavelength has been limited to about 1 nm because the processing margin is insufficient when producing an element while setting a particular wavelength in the processes of crystal growth and wafer processing, use of the DFB-LD as the light source for wavelength division multiplexing transmission has been impractical for the reason of the accuracy of oscillation wavelength.

Sudoh et al. (ELECTRONICS LETTERS; Jan. 30, 1997 Vol.33, No.3, p.216–p.217) have recently reported a DFB-LD that enabled it to tune the oscillation wavelength to a desired value by a method as follows: A part of an optical waveguide of a DFB-LD is provided with a film made of a material that changes refractive index depending on the heat generated by laser irradiation, and the refractive index of the film is changed by irradiating it with a laser beam while measuring the oscillation wavelength of the DFB-LD after the laser element has been made, thereby changing the effective refractive index of the waveguide and achieving the desired oscillation wavelength.

Although demands for laser elements having more accurate oscillation wavelengths are increasing, the demands cannot be satisfied in the production process only. Thus such techniques have been developed that achieve laser elements having the desired oscillation wavelengths by adjusting the oscillation wavelength after producing the laser element.

Adjustment of the characteristic values to be done after producing the laser element includes, in addition to the oscillation wavelength of the DFB-LD, adjustment of other characteristic values such as the photon density in an active layer of a ridge type semiconductor laser.

FIG. 10 is a sectional view showing the structure of a DFB-LD of the prior art.

In FIG. 10, reference numeral 1 denotes an n-InP substrate, 2 denotes an n-InP buffer layer, 3 denotes an n-InGaAsP light confinement layer, 4 denotes an MQW active layer, 5 denotes a p-InGaAsP light confinement layer, 6 denotes a diffraction grating layer, 7 denotes a p-InP first cladding layer, 8 denotes an Fe-doped InP embedding layer, 9 denotes an n-InP embedding layer, 10 denotes a p-InP second cladding layer, 11 denotes a p-InGaAs contact layer, 12 denotes an SiO2 insulating film,.13 denotes a Cr/Au vapor deposited film and 14 denotes an anode of Au-plating layer. 15 denotes a metallic vapor deposited film and 16 denotes a cathode of Au-plating layer provided on the surface of the metallic vapor deposited film.

Oscillation wavelength $\lambda$ of the LD having the structure described above is given as follows assuming the effective refractive index neff of the optical waveguide and the interval $\Lambda$ of the diffraction grating.

$$\lambda = 2 \cdot \text{neff} \cdot \Lambda$$

When $\Lambda$ is 240 nm and neff is 3.23, for example, then $\lambda$ is 1550.4 nm.

Factors that determine the value of neff include the distribution of refractive index of the material in a region from which light leaks out that is a circular area about 2 $\mu$m in diameter, and particularly important are composition and film thickness of the n-InGaAsP light confinement layer 3, the MQW active layer 4 and the p-InGaAs light confinement layer 5 that constitute the optical waveguide and the width of the optical waveguide.

However, the DFB-LD shown in FIG. 10 is difficult to produce due to variations in the process, while maintaining uniform conditions for the composition and film thickness of the n-InGaAsP light confinement layer 3, the MQW active layer 4 and the p-InGaAs light confinement layer 5 that constitute the optical waveguide and the width of the optical waveguide that are the factors which determine the value of neff, and therefore it has been difficult to produce the DFB-LD having oscillation wavelength of accuracy within ±0.1 nm due to the variation in neff.

One of the solutions for this problem is the wavelength tuning DFB-LD structure proposed by Sudoh et al. described previously.

FIG. 11 is a sectional view showing the structure of the wavelength tuning DFB-LD of the prior art.

In FIG. 11, reference numeral 21 denotes an n⁺-InP substrate, 22 denotes an n-InP layer, 23 denotes an active layer, 24 denotes a diffraction grating layer, 25 denotes a p-InP layer, 26 denotes a p⁺-InGaAs layer, 27 denotes Ti/Au electrode, 28 denotes a wavelength control film made of $As_4Se_5Ge_1$ and 29 denotes an $Al_2O_3$ film.

When the wavelength control film 28 was irradiated with light emitted by a He-Ne laser of wavelength 632.8 nm with power density of 1.3 W/cm², a wavelength shift of 0.14 nm was observed.

FIG. 12 shows an embedding type DFB-LD of wavelength tuning type of the prior art which is a modification of the wavelength tuning DFB-LD structure proposed by Sudoh et al. turned into an embedding type DFB-LD shown in FIG. 10.

In FIG. 12, reference numerals identical with those used in FIG. 10 and FIG. 11 denote the same or corresponding components.

Changes in the refractive index of $As_4Se_5Ge_1$ that constitutes the wavelength control film 28 due to the wavelength of Ar laser light are reported in the ELECTRONICS LETTERS mentioned previously by Sudoh et al, indicating that maximum change in the refractive index at wavelength 1.55 $\mu$m was 0.027.

Thus assuming that width w of the optical waveguide of FIG. 11 is 1.3 $\mu$m, total width W of the optical waveguide including the embedding layers is 1.7 $\mu$m and thickness of the wavelength control film 28 is 0.5 $\mu$m, then the range of neff values of the adjustable effective refractive index determined upon computation of the light propagation mode is from 3.18716 to 3.18728. Consequently, when $\Lambda$ is 240 nm, adjustable range of the oscillation wavelengths is from 1529.84 nm to 1529.89 nm, giving a tunable band of 0.05 nm.

However, when the wavelength control film made of $As_4Se_5Ge_1$ is used as in the method described above, since the change in the refractive index of $As_4Se_5Ge_1$ caused by laser irradiation is an irreversible change, refractive index of the wavelength control film made of $AS_4Se_5Ge_1$ which has once decreased cannot be increased. Therefore, a failure in tuning the wavelength results in a rejected product out of the wavelength standard which cannot be tuned again. Thus there has been such a problem that the tuning operation must be done very carefully, leading to increased time taken which results in an increased production cost of the semiconductor laser element.

The present invention has been made to solve the problems described above.

A first object of the present invention is to provide a laser device that allows it to easily adjust the characteristic values of a laser element, thereby to produce the laser devices having uniform characteristics easily at a low cost.

A second object of the present invention is to provide a distributed feedback semiconductor laser device that allows it to easily adjust the oscillation wavelength and has a predetermined oscillation wavelength of high accuracy.

A third object of the present invention is to provide a ridge type semiconductor laser that allows it to adjust the photon density in an active layer and has a low threshold of oscillation at a low cost.

A fourth object of the present invention is to provide a method of producing a laser device that allows it to easily adjust characteristic values of a laser element, thereby to obtain the laser devices having good characteristics at a low cost.

Prior art for producing laser devices include, besides that shown in FIG. 10 through FIG. 12, for example, a semiconductor laser device disclosed in Japanese Patent Kokai Publication No. 8-116138. It is a semiconductor laser device having a semiconductor laser element sealed in a case that has a laser light emission window, while the element is cooled by circulating a liquid which is transparent to the light of the oscillation wavelength of the laser. The application mentioned above has no description with regards to forming at least a part of layers of the waveguide of the semiconductor laser element to such a predetermined width as light leaks from a side wall of the waveguide, and to adjustment of the oscillation wavelength by means of the fluid that makes contact with this part.

DISCLOSURE OF THE INVENTION

The laser device according to the present invention comprises a semiconductor substrate, a semiconductor laser element made in such a configuration as at least a part of layers of a waveguide that includes a first cladding layer of a first conductivity type, an active layer and a second cladding layer of a second conductivity type disposed successively on the substrate is formed to a predetermined width that allows light to leak from a side wall thereof along the direction of light propagation, a case that houses the semiconductor laser element disposed therein, the case surrounding the side wall of the waveguide and having an aperture capable of letting the fluid flow in and then sealing the case, and a fluid that is sealed in the case to make contact with the side wall and has a predetermined refractive index, wherein intensity of light leaking from the side wall can be regulated by changing the refractive index of the fluid contacting the side wall of the waveguide, thus making it possible to adjust the characteristics values of the laser element.

According to the present invention, the waveguide is further provided with a diffraction grating layer, so that the effective refractive index of the optical waveguide can be controlled and the oscillation wavelength of the DFB-LD can be adjusted by changing the refractive index of the fluid that makes contact with the side wall of the waveguide.

Also a part of thickness of the second cladding layer of the waveguide is formed into a ridge that has a predetermined width which allows light to leak, so that the photon density in the active layer of the ridge type laser can be adjusted by regulating the intensity of light leaking from the second cladding layer.

Also the laser element is disposed in the case that surrounds the side wall and has a first part comprising the aperture capable of letting the fluid flow in and then sealing the case and a second part having an emission window provided therein to oppose an light emitting end face of the laser element, the first part and the second part being disposed to interpose a partition wall that seals off the fluid, so that there will occur no decrease in the emission efficiency and in the single-mode oscillation performance since the laser light emission end face does not make contact with the fluid that has the predetermined refractive index and the reflectivity of the emission end face does not change.

Moreover, the laser element is disposed in the case and walls that constitute a same chamber of the case have the emission window disposed to oppose the light emitting end face of the laser element and the aperture capable of letting the fluid flow in and then sealing the case, thereby making the constitution simple.

Furthermore, silicon oil is used as the fluid that has high heat conductivity, and therefore thermal stability of the laser device is improved.

The method of producing the semiconductor device according to the present invention includes a process of operating the semiconductor laser element, letting fluids of different refractive indices successively through the aperture into the case, and adjusting the characteristic values while measuring the characteristic values of the laser element, and therefore the characteristic values of the laser element can be adjusted in a reversible manner, thus resulting in improved yield of production.

Also because an inlet aperture and an outlet aperture are provided so that fluids of different refractive indices can be caused to continuously flow in and out through the inlet aperture and the outlet aperture while adjusting the characteristic values, thus time taken in the adjustment can be reduced.

BEST MODE FOR CARRYING OUT THE INVENTION

The embodiment of the present invention provides a laser device comprising a semiconductor substrate, a semiconductor laser element made in such a configuration as at least a part of layers of a waveguide that includes a first cladding layer of a first conductivity type, an active layer and a second cladding layer of a second conductivity type disposed successively on the substrate, for example the waveguide that includes the first cladding layer, the active layer and the second cladding layer of the second conductivity type in the case of the DFB-LD, or a ridge formed on a residual thickness of the second cladding layer in the case of a ridge type laser, is formed to a predetermined width that allows light to leak from a side wall along the direction of light transmission, a case that houses the semiconductor laser element disposed therein while surrounding the side wall of the waveguide and having an aperture capable of letting a fluid flow in and then sealing the case, and a fluid that is sealed in the case to make contact with the side wall and has a predetermined refractive index.

According to a method of producing the laser device, for the semiconductor laser element made in such a configuration as at least a part of layers of waveguide that includes a first cladding layer of a first conductivity type, an active layer and a second cladding layer of a second conductivity type disposed successively on the substrate, for example the waveguide that includes the first cladding layer, the active layer and the second cladding layer of the second conductivity type in the case of the DFB-LD, or a ridge formed on a residual thickness of the second cladding layer in the case of a ridge type laser, is formed to a predetermined width that allows light to leak from a side wall along the direction of light transmission, a case that houses the semiconductor laser element disposed therein while surrounding the side wall of the waveguide and having an aperture capable of letting the fluid flow in and then sealing the case, wherein the semiconductor laser element is operated, fluids of different refractive indices are circulated successively through the aperture into and out of the case, and the characteristic values are adjusted while measuring the characteristic values of the laser element.

Accordingly, it is made possible to constitute the laser device that allows it to easily adjust the characteristic values of the laser element, thereby to produce the laser devices having uniform characteristics at a low cost.

Also according to the method of producing the laser device described above, it is made possible to easily adjust the characteristic values of the laser element to predetermined values, and produce the laser devices having uniform characteristics at a low cost Now particular embodiments of the invention will be described below.

A. Embodiment 1

Figure 1:
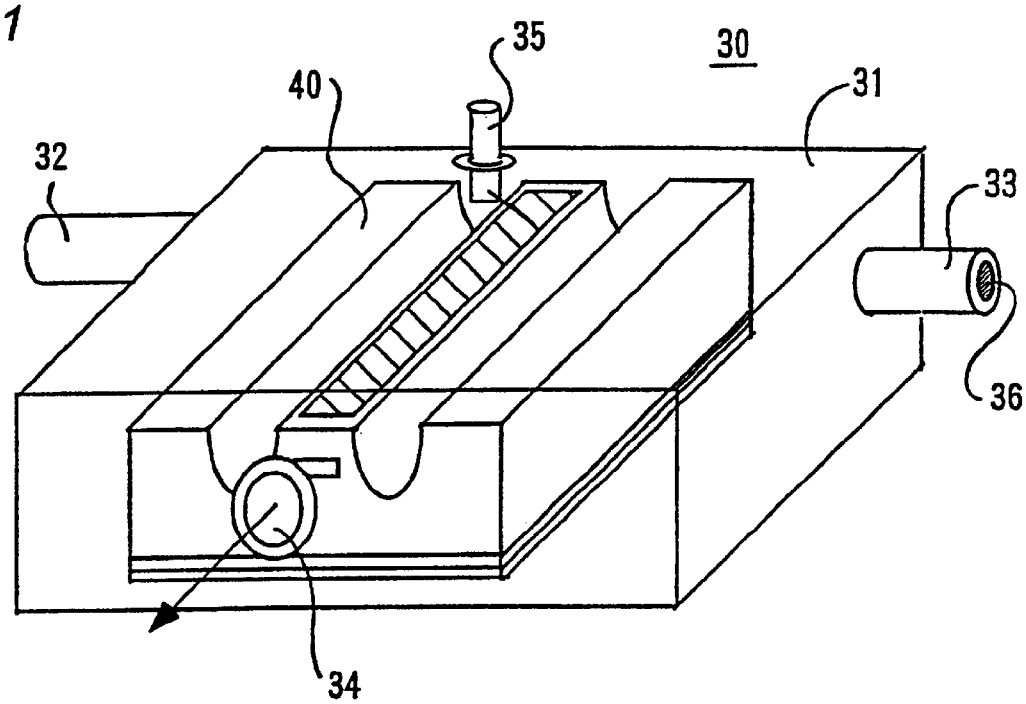
FIG. 1 is a partially transparent perspective view of a laser device according to the first embodiment of the present invention.

FIG. 1 is a partially transparent perspective view of a laser device according to the first embodiment of the present invention.

In FIG. 1, reference numeral 30 denotes a laser device, 31 denotes a package serving as a case made of, for example, iron, copper or a copper-tungsten alloy. Reference numeral 32 denotes a fluid inlet port provided on a wall of the package, 33 denotes a fluid outlet port provided on a wall of the package 31, both the inlet port 32 and the outlet port 33 being hermetically sealed with plugs 36 after the inside has been filled with the fluid. 34 denotes a laser light emission window made of a material that is transparent to the laser light, such as quartz. An arrow drawn on the emission window indicates the laser light. 35 denotes an anode terminal.

Figure 2:
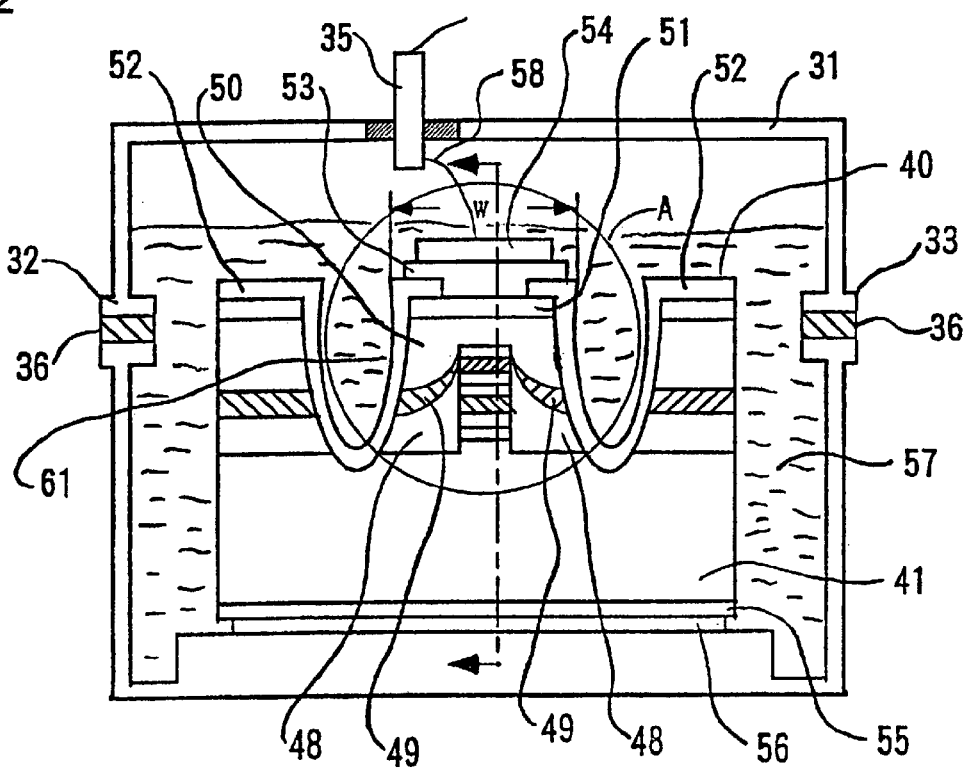
FIG. 2 is a sectional view of a laser device according to the first embodiment of the present invention.
Figure 3:
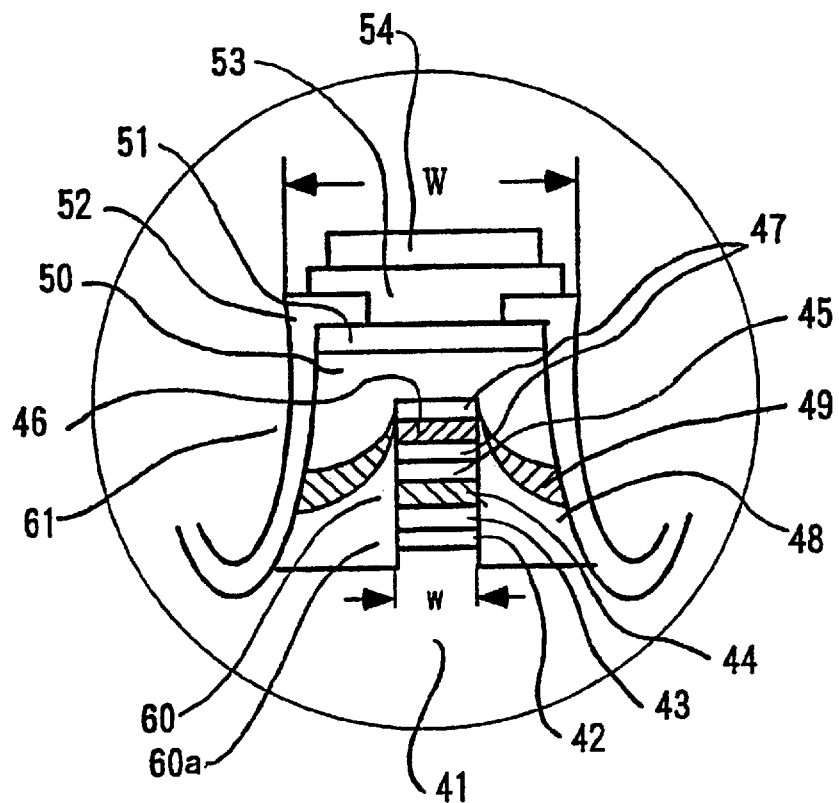
FIG. 3 is partially enlarged sectional view of a laser element according to the first embodiment of the present invention.
Figure 4:
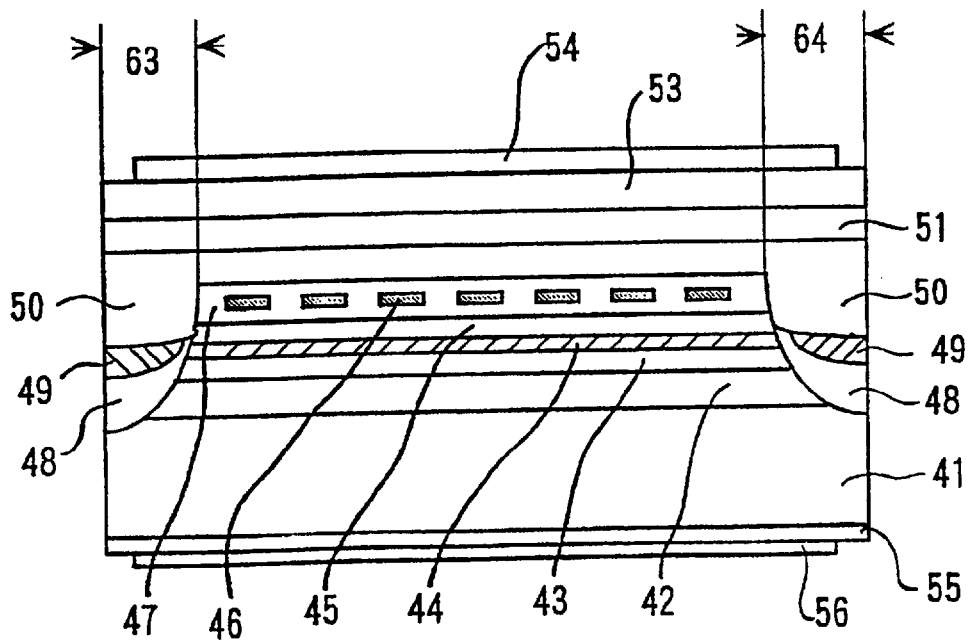
FIG. 4 is a sectional view of the laser element according to the first embodiment of the present invention.

FIG. 2 is a sectional view of the laser device shown in FIG. 1 in a cross section perpendicular to the laser light emitting direction. FIG. 3 is an enlarged sectional view of portion A enclosed in a circle in FIG. 2. FIG. 4 is a sectional view of the semiconductor laser element in a cross section (along line indicated by arrows in FIG. 2) parallel to the laser light emitting direction.

In FIG. 2, FIG. 3 and FIG. 4, reference numeral 40 denotes an embedding type DFB-LD element. 41 denotes an n-InP substrate containing n-type impurity of Sn or S with impurity concentration of $1 \times 10^{18}$ cm$^{-3}$ (hereafter denoted as 1E18 cm$^{-3}$). 42 denotes an n-InP buffer layer with impurity concentration in a range from 1E18 cm$^{-3}$ to 1E19 cm$^{-3}$, 43 denotes an n-InGaAsP light confinement layer with impurity concentration of 5E17 cm$^{-3}$, 44 denotes an MQW active layer formed by stacking InGaAs and InGaAsP alternately and 45 denotes a p-InGaAsP light confinement layer containing p-type impurity of Zn with impurity concentration of 5E17 cm$^{-3}$, 46 denotes a diffraction grating formed by etching an InGaAsP layer, 47 denotes a p-InP first cladding layer with impurity concentration in a range from 5E17 cm$^{-3}$ to 1E18 cm$^{-3}$, 48 denotes an Fe-doped InP embedding layer, 49 denotes an n-InP embedding layer with impurity concentration of 1E18 cm$^{-3}$, 50 denotes a p-InP second cladding layer with impurity concentration in a range from 5E17 cm$^{-3}$ to 1E18 cm$^{-3}$, 51 denotes a p-InGaAs contact layer with impurity concentration of 1E19 cm$^{-3}$, 52 denotes an SiO$_2$ insulating film, 53 denotes a Cr/Au vapor-deposited film and 54 denotes an Au-plating layer with the Cr/Au vapor-deposited film 53 and the Au-plating layer 54 constituting an anode. 55 denotes a vapor-deposited film comprising AuGe/

Ni/Ti/Pt/Ti/Pt/Au, 56 denotes an Au-plating layer formed on the surface of the vapor-deposited film 55, while the vapor-deposited film 55 and the Au-plating layer 56 constituting a cathode. 57 denotes a fluid that has a predetermined refractive index that fills the package. Silicon oil is used for the fluid. Use of silicon oil as the fluid makes it possible to adjust the refractive index and makes it easy to cool down the laser element due to the high heat conductivity.

The Au-plating layer 54 is connected by a lead wire 58 to the anode terminal 35. The Au-plating layer 56 is provided on the package 31, and is grounded via the package 31. In order to remove heat generated when the DFB-LD element 40 is operating, the package 31 is placed on a cooling device (not shown) that employs a Peltier element, thereby to cool the fluid 57 that fills the package 31 and prevents the DFB-LD element 40 from being heated to a high temperature.

Now the operation of the DFB-LD will be described below.

When positive holes are injected through the anode and electrons are injected through the cathode so that electrons and positive holes are confined in the MQW active layer 44 with the electron-hole density reaching a sufficient level, stimulated emission of light takes place thus achieving light amplification. A resonator is formed by providing the diffraction grating 46 in an amplification region where the light output is amplified, with at least a part of the light output from the amplification region is returned to this region by using the diffraction grating 46, thereby forming a feedback loop and maintaining oscillation, with laser light being emitted through the emission end face.

The diffraction grating 46 has a portion where the phase is shifted by $\lambda/4$ ($\lambda$ represents the wavelength) in the middle of the LD resonator. The MQW active layer 44 is interrupted near the front end and rear end of the LD, where windows 63, 64 are formed by embedding with the Fe-doped InP embedding layer 48, the n-InP embedding layer 49 and the p-InP second cladding layer 50. Formed on the front end face and the rear end face of the LD are vapor-deposited films made of $Al_2O_3$ with a thickness of $\lambda/4$ not shown in the drawing, thus reducing the reflectivity.

Now the method of producing the laser device 30 will be described below.

The DFB-LD element 40 used in the laser device 30 is made by forming the n-InP buffer layer 42, the n-InGaAsP light confinement layer 43, the MQW active layer 44, the p-InGaAsP light confinement layer 45, the p-InP first cladding layer 47 and the diffraction grating layer 46 successively on the n-InP substrate 41 by vapor phase growth process, a diffraction grating is formed by etching, and then the p-InP first cladding layer 47 is formed again, thereby embedding the diffraction grating. Then the layers are etched until the n-InP substrate 41 is exposed, leaving a ridge 60a having width w of 1.3 μm as an optical waveguide 60.

The ridge 60a is then embedded by forming the Fe-doped InP embedding layer 48 and the n-InP embedding layer 49 by selective growth on both sides of the ridge 60a, followed by the formation of the p-InP second cladding layer 50 and the p-InGaAs contact layer 51 on the ridge 60a and the n-InP embedding layer 49.

Then the layers on both sides of the ridge 60a that is located at the center are etched until the n-InP substrate 41 is exposed, leaving a portion of width not greater than 2 μm, thereby to form a semiconductor mesa, followed by the formation of the $SiO_2$ insulating film 52 on the surface and removal of that over the ridge 60a. Then the Cr/Au vapor-deposited film 53 and the Au-plating layer 54 are formed thereby to form the anode.

Assuming the semiconductor mesa 61 that includes the optical waveguide 60, the embedding layers 48, 49 formed on both sides of the optical waveguide 60 and the $SiO_2$ insulating film 52 has width W, since the region where light leaks is a circular region of radius about 2 μm, it is necessary to keep the width W within about 4 μm in order to control the oscillation wavelength of the laser light by regulating the intensity of the leaking light, and the smaller the width, the easier to control the wavelength. However, the width cannot be made too small due to the necessity to form the anode. Thus width W is set to be greater than the width of the ridge 60a and not greater than 4.0 μm. More preferably, width W is set to be greater than the width of the ridge 60a and not greater than 1.2 μm.

The DFB-LD element 40 formed as described above is disposed in the package 31 which is then filled with the silicon oil 57 of which refractive index is controlled to a predetermined value, and the side walls of the semiconductor mesa 61 is immersed in the silicon oil 57.

The refractive index of the silicon oil 57 corresponding to the oscillation wavelength required is determined as described below.

Silicon oils of different refractive indices are prepared as D. Bosc et al described in IEEE PHOTONICS TECHNOLOGY LETTERS, Vol.9, No.5, May 1977 p648–p650. That is, by using a mixture of a plurality of silicon oils having different kinds of impurity in different concentrations, it is made possible to change the refractive index of a cavity 62 filled with the silicon oil in the package 31 in a range from 1.432 to 1.447.

Then the silicon oils of different refractive indices are poured into the package 31 so that the side walls of the semiconductor mesa 61 is immersed in the silicon oil 57. At this time, the DFB-LD is operated and the silicon oils of different refractive indices are poured into the package successively while monitoring the oscillation wavelength with an optical spectrum analyzer. In order to change the refractive index of the silicon oil continuously, a mixture of two kinds of silicon oils of different refractive indices may be poured into the package 31 while changing the mixing proportion continuously. This procedure can reduce the time taken in the adjustment.

When the predetermined oscillation wavelength is obtained, supply of the silicon oil is stopped and the inlet aperture 32 and the outlet aperture 33 are sealed with the plugs 36, thereby fixing the oscillation wavelength of the laser device 30.

With the procedure of adjusting the wavelength using the silicon oils of different refractive indices, when the refractive index of the silicon oil mixture is set too high or too low, the refractive index of the silicon oil mixture can be corrected in the reverse direction. Namely, oscillation wavelength can be adjusted reversibly.

Assuming that ridge width w of the optical waveguide 60 is 0.7 μm and total width W of the semiconductor mesa 61 including the optical waveguide is 1.0 μm, for example, then the range of effective refractive index neff of the waveguide 60 changes in a range from 3.1486 to 3.14190 when the refractive index of the cavity 62 filled with the silicon oil in the package 31 is changed from 1.432 to 1.447. Consequently, when assuming $\Lambda$ is 240 nm for the diffraction grating, adjustable range of the oscillation wavelength of the laser device 30 is from 1508.093 nm to 1508.11 nm.

Figure 5:
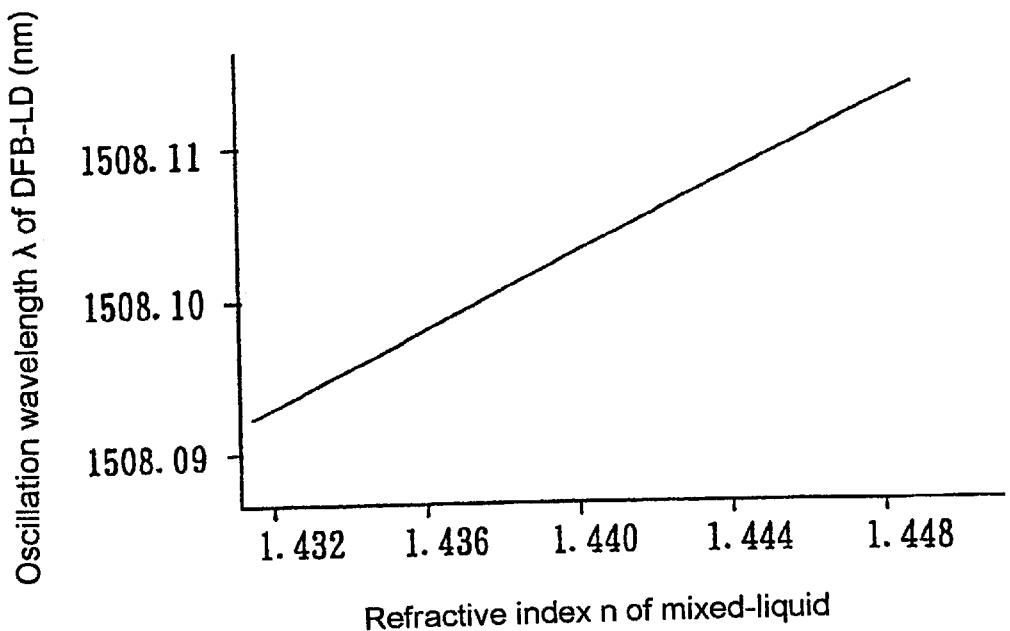
FIG. 5 is a graph showing the relation between the refractive index of silicon oil and oscillation wavelength of DFB-LD according to the present invention.

FIG. 5 is a graph showing the relation between the refractive index of silicon oil and the oscillation wavelength of the DFB-LD according to the present invention, based on the result described above.

Refractive indices of the materials used near the waveguide 60 are 3.3 for the n-InGaAsP light confinement layer 43 and the p-InGaAsP light confinement layer 45, from 3.4 to 3.6 for the MQW active layer 44, 3.3 for the diffraction grating 46, 3.17 for the p-InP first cladding layer, and 3.17 for the Fe-doped InP embedding layer, the n-InP embedding layer 49 and the p-InP second cladding layer 50.

In this embodiment, since the fluid 57 used for the control of the oscillation wavelength has a low refractive index of about 1.44, less intensity of light leaks into the portion of the liquid 57 capable of adjusting the refractive index, thus resulting in smaller range of oscillation wavelengths adjustable. However, provided that a material having higher refractive index can be used for the liquid 57, intensity of light leaking into the liquid 57 can be increased, thereby increasing the adjustable range of the oscillation wavelengths. Although the silicon oil is used for the liquid to control the refractive index in this embodiment, the liquid is not limited to a particular material and any materials that have different refractive indices and can be mixed in a desired proportion can be used. Also instead of liquid, the refractive index can be changed by mixing gases having different refractive indices.

According to this embodiment, as described above, oscillation wavelength can be continuously and easily changed by making the semiconductor mesa 61 in such a width as light leaks out therefrom and bringing the silicon oils of different refractive indices successively into contact with the side walls of the semiconductor mesa-61. Thus the DFB-LD having the oscillation wavelength adjusted with high accuracy can be made at a low cost, as the light source for wavelength division multiplexing optical transmission.

B. Embodiment 2

Figure 6:
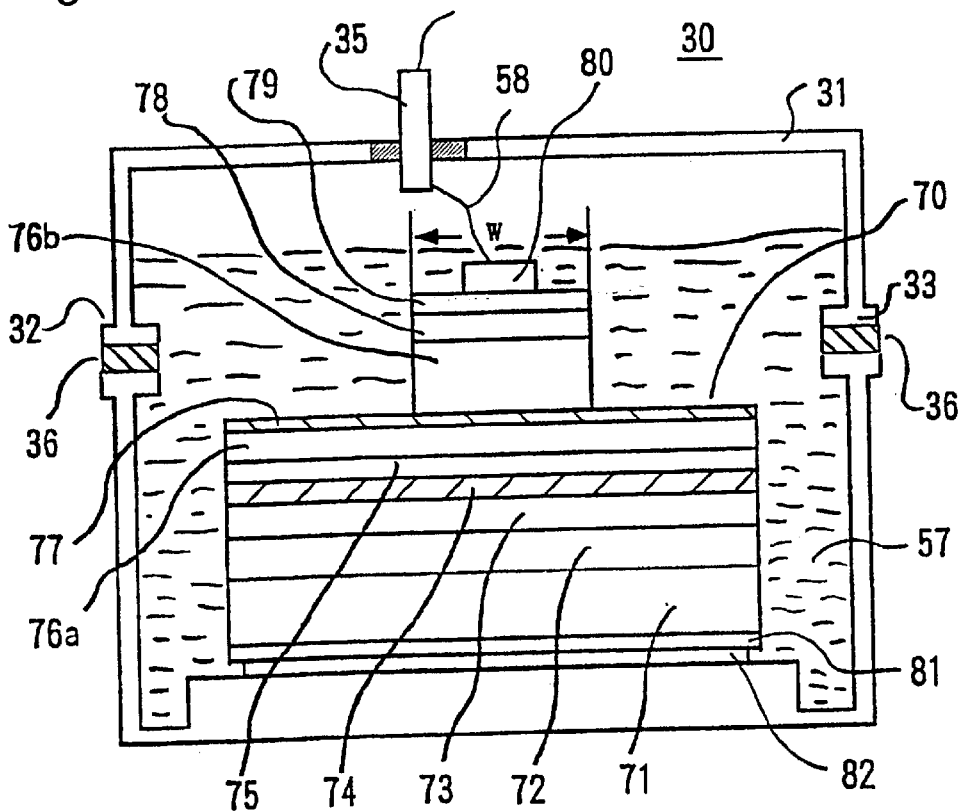
FIG. 6 is a sectional view of a laser device according to the second embodiment of the present invention.

FIG. 6 is a sectional view of the laser device according to the second embodiment of the present invention.

In FIG. 6, the same reference numerals as those in the first embodiment denote the same or corresponding parts.

Reference numeral 70 denotes a ridge type laser diode element (hereafter referred to as ridge type LD element), 71 denotes an n-GaAs substrate containing n-type impurity of Si or Se with impurity concentration of 1E18 cm$^{-3}$, 72 denotes an n-AlGaAs cladding layer containing n-type impurity of Se with impurity concentration of 2E17 cm$^{-3}$, 73 denotes an n-AlGaAs light confinement layer containing n-type impurity of Se with impurity concentration of 2E17 cm$^{-3}$, 74 denotes an undoped AlGaAs active layer, 75 denotes a p-AlGaAs light confinement layer containing p-type impurity of Zn with impurity concentration of 5E17 cm$^{-3}$, 76a denotes a residual layer of the p-type AlGaAs cladding layer containing p-type impurity of Zn with impurity concentration of 5E17 cm$^{-3}$, 76b denotes a ridge portion of the p-AlGaAs cladding layer containing p-type impurity of Zn with impurity concentration of 5E17 cm$^{-3}$, 77 denotes a p-type AlGaAs etching stopper layer containing p-type impurity of Zn with impurity concentration of 5E17 cm$^{-3}$, 78 denotes a p-GaAs cap layer containing p-type impurity of Zn with impurity concentration in a range from 5E17 cm$^{-3}$ to 1E18 cm$^{-3}$, 79 denotes a Ti/Mo/Ti/Au vapor-deposited film, 80 denotes an Au-plating layer, the vapor-deposited film 79 and the Au-plating layer 80 constituting the anode. Reference numeral 81 denotes an vapor-deposited film comprising AuGe/Ni/Ti/Pt/Ti/Pt/Au, 82 denotes an Au-plating layer, the vapor-deposited film 81 and the Au-plating layer 82 constituting the cathode.

This embodiment is the same as the first embodiment in the constitution of the package 31, use of silicon oil as the fluid, connection of the anode 80 by the lead wire 58 to the anode terminal 35, mounting of the cathode 82 on the package 31, grounding of the cathode 82 through the package 31, and removal of heat generated during the operation of the ridge type LD element 70 by placing the package 31 on a cooling device (not shown) that employs a Peltier element thereby to cool the silicon oil 57 that fills the package 31 thereby preventing the ridge type LD element 70 from being heated to a high temperature.

Now the method of producing the ridge type LD element 40 will be described below.

The n-AlGaAs cladding layer 72, the n-AlGaAs light confinement layer 73, AlGaAs active layer 74, the p-AlGaAs light confinement layer 75, the residual layer 76a of the p-type AlGaAs cladding layer, the etching stopper layer 77, the p-AlGaAs cladding layer that becomes the ridge portion 76b and the p-GaAs cap layer 78 are formed successively by vapor phase growth process on the n-GaAs substrate 71.

Then the ridge portion 76b is formed by etching the layers until the etching stopper layer 77 is exposed while leaving a predetermined ridge width from the p-GaAs cap layer 78.

The Ti/Mo/Ti/Au vapor-deposited film 79 and the Au-plating layer 80 are then formed on the p-GaAs cap layer 78 to form the anode, while the vapor-deposited film comprising AuGe/Ni/Ti/Pt/Ti/Pt/Au 81 and the Au-plating layer 82 are formed on the back surface of the n-GaAs substrate 71 to form the cathode.

The ridge type LD element 70 requires it to control the photon density in the active layer 74, that makes it necessary to make the thickness d of the residual layer 76a of the p-AlGaAs cladding layer and the ridge width W of the ridge portion 76b of the p-AlGaAs cladding layer with an accuracy of within 0.1 $\mu$m.

In case the ridge width W of the ridge portion 76b becomes greater than the predetermined width in comparison to the thickness d of the residual layer 76a, photon density in the active layer 74 becomes higher and optical damage of the laser may be induced. On the other hand, when the ridge width W of the ridge portion 76b becomes smaller than the predetermined width in comparison to the thickness d of the residual layer 76a, photon density decreases because insufficient light is confined in the active layer 74 located directly below the ridge portion 76b, resulting in less light confined in the region where current is injected. This leads to lower gain of the laser and higher threshold of oscillation.

The thickness d of the residual layer 76a can be made accurately by providing the etching stopper layer 77 thereby controlling the depth of etching, although it has not been possible to make the ridge width W of the ridge portion 76b uniformly with high accuracy due to side etching, and the ridge type LD element 70 has not been produced with a high yield.

In this embodiment, the laser device 31 wherein the photon density distribution in the active layer can be adjusted is made by bringing a fluid having a predetermined refractive index into contact with the side walls of the ridge portion 76b.

Description of the method of producing the laser device 31 will be continued.

The ridge type LD element 70 that has the configuration and is produced as described above is placed in the package 31, into which a fluid having a predetermined refractive index, for example silicon oil 57, is let flow in through the inlet port 32. Refractive index of the silicon oil 57 can be adjusted similarly to the method described in conjunction with the first embodiment. Specifically, a near field image or a far field image of the ridge type LD element 70 is observed while changing the mixing proportion of the silicon oil 57 thereby changing the refractive index and, when the desired image is obtained, supply of the silicon oil 57 is stopped and the inlet aperture 32 and the outlet aperture 33 are sealed with the plugs 36.

In order to make satisfactory adjustment of the photon density distribution in the active layer 74, for the ridge type LD element 70 formed with the ridge width W of the ridge portion 76b greater than the predetermined width in comparison to the thickness d of the residual layer 76a, refractive index of the silicon oil 57 is increased so as to increase the intensity of light leaking through the side wall of the ridge portion 76b to the outside, thereby reducing the photon density in the active layer located right below the ridge portion 76b. This makes it possible to prevent optical damage from occurring in the laser and elongate the service life of the ridge type LD element 70.

In case the ridge width W of the ridge portion 76b is made smaller than the predetermined width in comparison to the thickness d of the residual layer 76a, refractive index of the silicon oil 57 is decreased so as to increase the degree of light confinement in the active layer located right below the ridge portion 76b. This results in increased gain of the laser and lower threshold of oscillation. Moreover, it is made possible to make a laser device of higher power efficiency.

Thus according to this embodiment, a laser device having a high power efficiency ridge type LD element of high reliability can be made allowing it to adjust the laser characteristics after producing the ridge type LD element, and therefore the production process can have generous margin so that a high yield can be achieved, thus reducing the production cost of the ridge type LD element.

C. Embodiment 3

Figure 7:
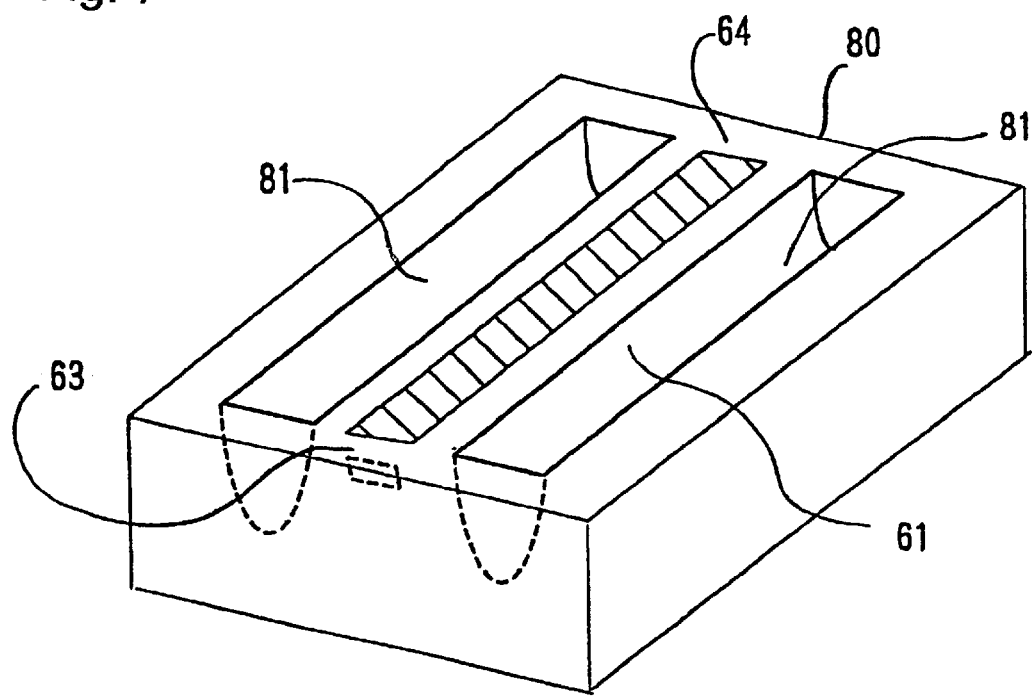
FIG. 7 is a perspective view of a laser device according to the third embodiment of the present invention.

FIG. 7 is a perspective view of the DFB-LD used in the laser device according to the third embodiment of the present invention. FIG. 6 is a sectional view of the laser device of this embodiment.

Figure 8:
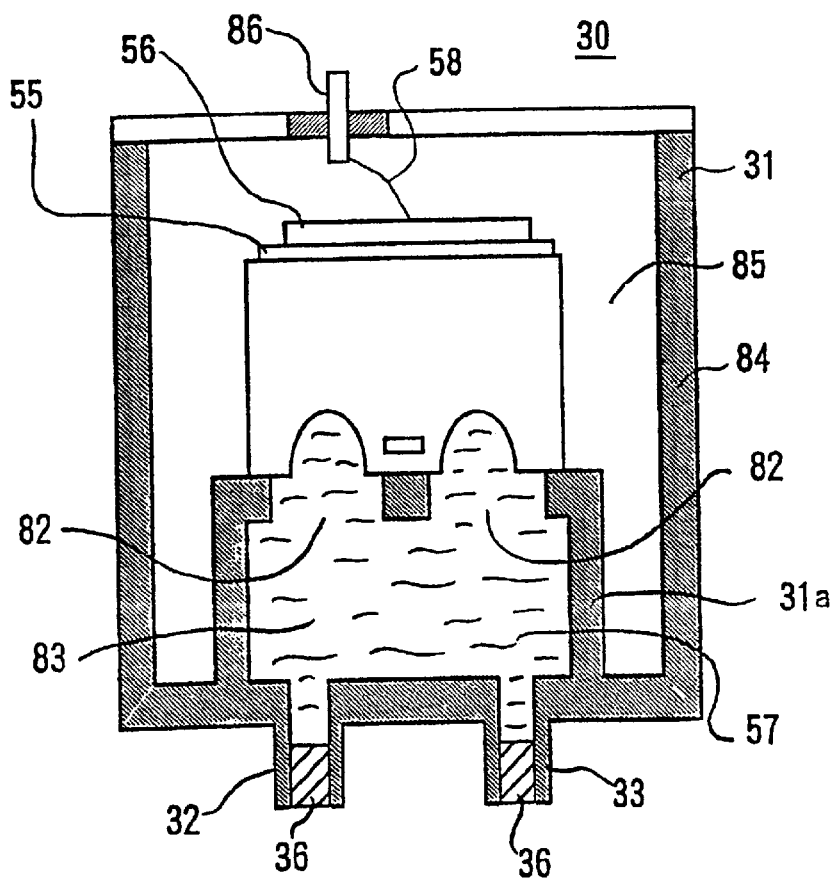
FIG. 8 is a sectional view of the laser device according to the third embodiment of the present invention.

In FIG. 7 and FIG. 8, reference numerals identical with those of the first embodiment denote the same or corresponding components.

In FIG. 7, reference numeral 80 denotes the DFB-LD. In contrast to the DFB-LD 40 of the first embodiment where the semiconductor mesa 61 is provided to penetrate through both end faces in the light emitting direction, this embodiment is different in that the semiconductor mesa 61 is not formed in the portions of the windows 63, 64 on both ends. Thus portions near both ends where the side walls of the semiconductor mesa 61 contact the fluid are formed in closed recesses 81. In other regards, the structure is similar to that of the DFB-LD of the first embodiment.

In FIG. 8, reference numeral 31a denotes a base that serves as a partition wall to separate the fluid that fills the package 31. Formed on top of the base 31a are holes 82 having edges that correspond to the recesses 81 of the DFB-LD 80. When the recesses 81 of the DFB-LD 80 and the holes 82 of the base 31a are aligned and the DFB-LD 80 is die-bonded onto the base 31a with the junction facing down, a sealed cavity 83 is formed by the base 31a, DFB-LD 80 and the recesses 81. The cavity 83 is filled with a fluid. The fluid, in this case silicon oil similarly to the first embodiment, is circulated through the inlet port 32 and the outlet port 33 while changing the refractive index of the fluid 57, thereby adjusting the oscillation wavelength of the laser device 30. Even when the fluid is sealed in the cavity 83, the fluid does not enter the cavity 85 that is delimited by the outer walls 84 of the package 31 since the fluid is sealed by the base 31a and the DFB-LD 80. As a result, laser light emitting portion of the DFB-LD 80 does not make contact with the fluid that enters the cavity 83 in spite of the light emission window (not shown) being disposed to oppose the laser light emitting portion of the DFB-LD 80.

Therefore, the outer walls 84 of the package 31 is not necessarily required.

The cathode of the DFB-LD 80 and the cathode terminal 86 are connected with each other by the lead wire 58.

This embodiment also enables it to adjust the oscillation wavelength similarly to the first embodiment, and therefore has effects similar to those of the first embodiment. In addition, this embodiment has such effect as the light emission end face of the DFB-LD 40 does not contact the silicon oil 57 so that the reflectivity of the window 64 of the light emission end face does not change in response to the silicon oil, thus making it possible to maintain the desired emission efficiency without deterioration in the single-mode operation performance.

Figure 9:
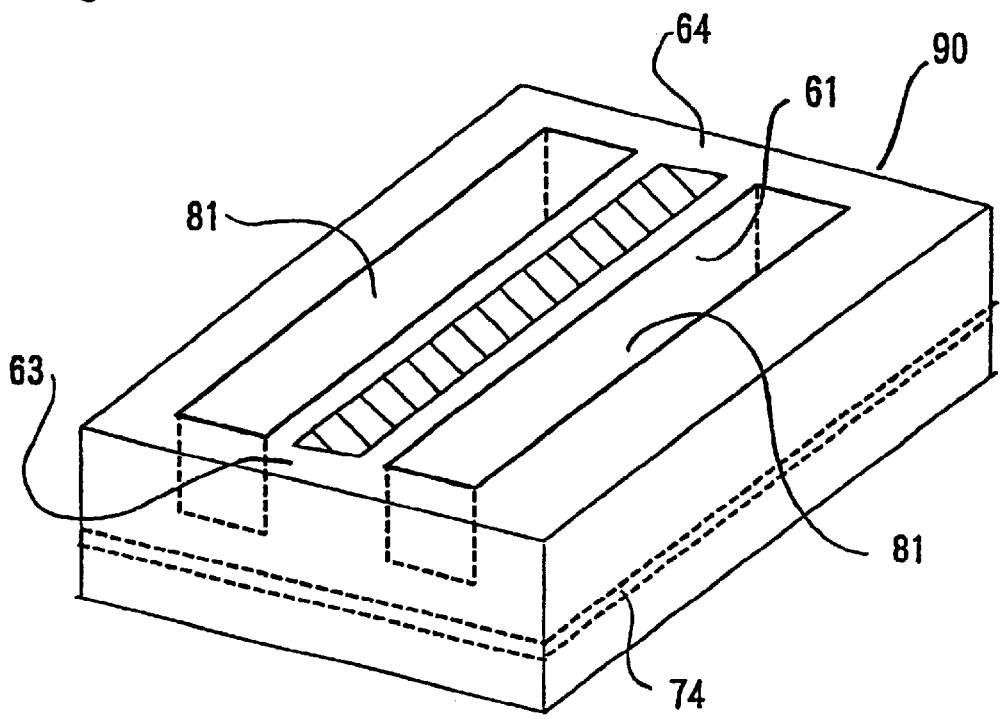
FIG. 9 is a perspective view of a variation of the laser element according to the third embodiment of the present invention.
Figure 10:
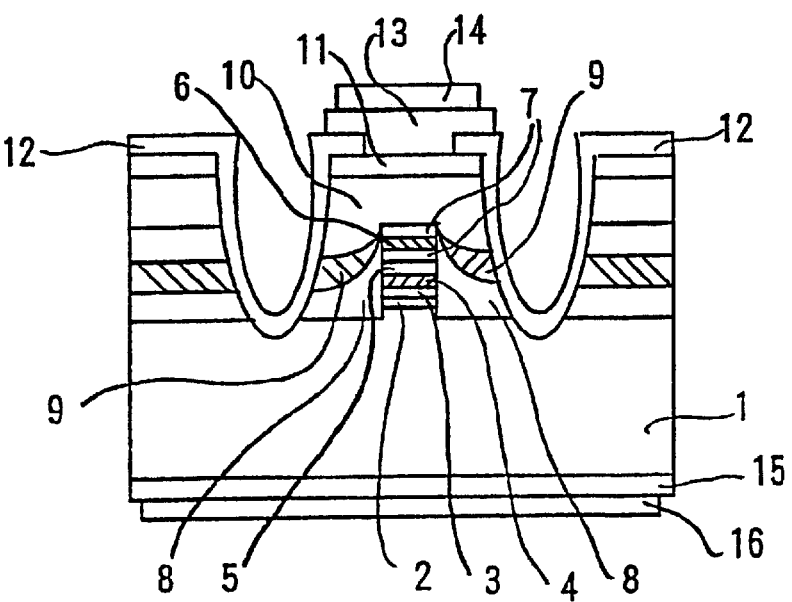
FIG. 10 is a sectional view of a prior art laser device.
Figure 11:
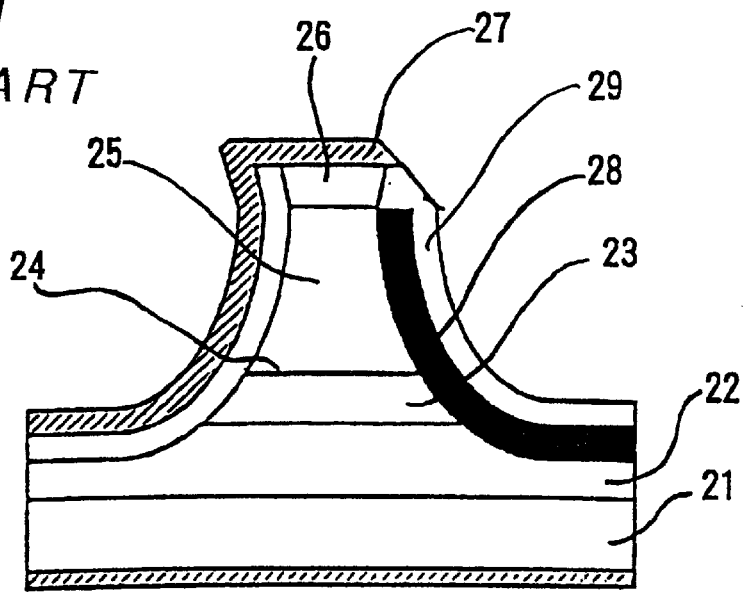
FIG. 11 is a sectional view of a prior art laser device.
Figure 12:
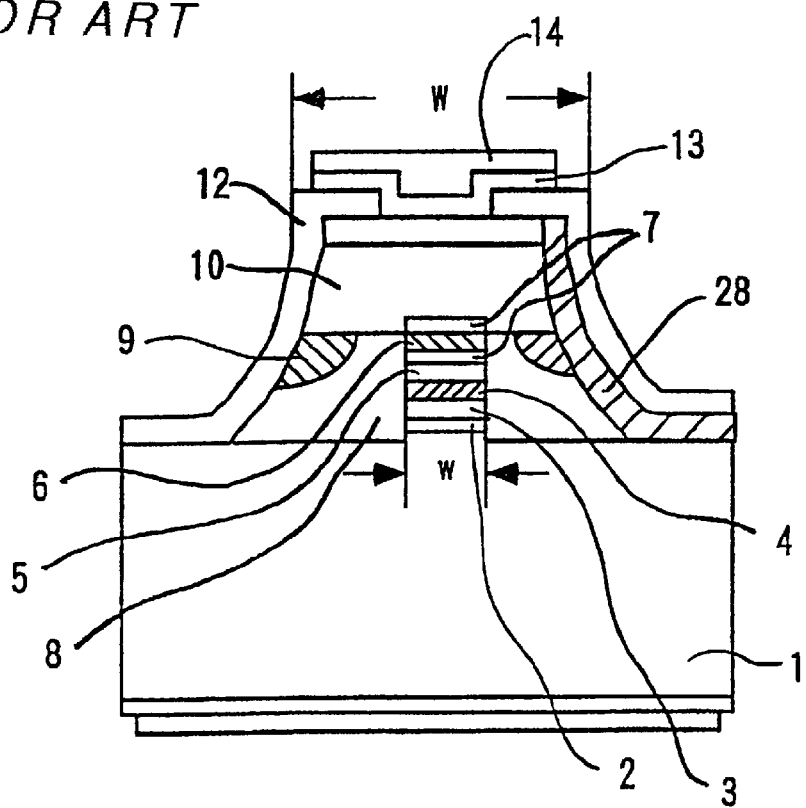
FIG. 12 is a sectional view of a prior art laser device.

FIG. 9 is a perspective-view of a ridge type LD element used in a laser device according to the third embodiment of the present invention.

In this ridge type LD element 90, too, the semiconductor mesa 61 does not have mesa structure in the portions of windows 63, 64 near both ends. In other regards, the structure is similar to that of the ridge type LD element 70 of the second embodiment.

Thus portions near both ends where the side walls of the semiconductor mesa 61 contact the fluid are formed in closed recesses 81. In this ridge type LD element 90, too, when the recesses 81 of the ridge type LD element 90 and the holes 82 of the base 31a are aligned with each other, and die-bonded onto the base 31a with the junction facing down, the sealed cavity 83 is formed by the base 31a, the ridge type LD element 90 and the recesses 81 in a package 31 shown in FIG. 8. The cavity 83 is filled with a fluid. The fluid 57, in this case silicon oil 57 similarly to the second embodiment, is circulated through the inlet port 32 and the outlet port 33 while changing the refractive index of the fluid 57, thereby adjusting the photon density in the active layer located right below the ridge portion 76b of the ridge type LD element 90.

This embodiment also has effects similar to those of the second embodiment. In addition, this embodiment has such an effect as the light emission end face of the ridge type LD element 90 does not contact the fluid 57 so that the reflectivity of the window 63 of the light emission end face does not change in response to the fluid 57, thus making it possible to maintain the desired emission efficiency.

Industrial Applicability

As will be understood from the foregoing description, the laser device according to the present invention is useful as the light source for wavelength division multiplexing transmission in such applications as optical signal transmission through trunk lines such as submarine cable.

What is claimed is:

1. A laser device comprising:
   a semiconductor substrate,
   a semiconductor laser element having a waveguide that includes a first cladding layer of a first conductivity type, an active layer, and a second cladding layer of a second conductivity type, disposed successively on said substrate, a part of said layers having a width that allows light to leak from side walls of said waveguide along a direction of light propagation,
   a case having an aperture for admitting a fluid and sealing, said case housing said semiconductor laser element and surrounding said side walls of said waveguide and, a fluid in said case contacting said side walls of said waveguide and having a refractive index.

2. The laser device according to claim 1 wherein said waveguide includes a diffraction grating layer.

3. The laser device according to claim 1 wherein a part of said second cladding layer has a ridge that has a width which allows light to leak.

4. The laser device according to claim 1 wherein said case includes a first part having said aperture and a second part, said first part and said second part being separated by a partition wall that seals said fluid, said second part having an emission window opposite light emitting end face of said laser element.

5. The laser device according to claim 4 wherein said waveguide includes a diffraction grating layer.

6. The laser device according to claim 4 wherein a part of said second cladding layer has a ridge that has a width which allows light to leak.

7. The laser device according to claim 4 wherein said aperture and said emission window are located at the walls that form a cavity.

8. The laser device according to claim 7 wherein said waveguide includes a diffraction grating layer.

9. The laser device according to claim 7 wherein a part of said second cladding layer has a ridge that has a width which allows light to leak.

10. The laser device as in claim 1 wherein said fluid is silicone oil.

11. A method of producing a semiconductor device comprising:

preparing a laser device by placing a semiconductor laser element in a case, said semiconductor laser element having a semiconductor substrate and a waveguide that includes a first cladding layer of a first conductivity type, an active layer and a second cladding layer of a second conductivity type disposed successively on said on said waveguide, a part of said layers having a width that allows light to leak from side walls of said waveguide along a direction of light propagation, and said case having an aperture for admitting a fluid and sealing, said case housing said semiconductor laser element and surrounding the side walls of said waveguide, and adjusting a characteristic of said laser element by admitting fluids having different refractive indices successively through said aperture into said case while operating said semiconductor laser element and measuring characteristic of said laser element.

12. The method of producing a semiconductor device according to claim 11 wherein preparing a laser device comprises providing an inlet aperture and an outlet aperture as said aperture, and adjusting a characteristic of said laser element by admitting fluids having different refractive indices successively through said inlet aperture and extracting said fluids through said outlet aperture.

13. The method of producing a semiconductor device according to claim 11 wherein the characteristic is oscillation wavelength.

14. The method of producing a semiconductor device according to claim 11 wherein said characteristic is photon density of the active layer.

15. The method of producing a semiconductor device according to claim 12 wherein the characteristic is oscillation wavelength.

16. The method of producing a semiconductor device according to claim 12 wherein said characteristic is photon density of the active layer.

17. The laser device as in claim 4 wherein said fluid is silicone oil.

18. The laser device as in claim 7 wherein said fluid is silicone oil.

* * * * *